United States Patent [19]

Khadder et al.

[11] Patent Number: 5,012,305
[45] Date of Patent: Apr. 30, 1991

[54] HIGH SPEED JUNCTION FIELD EFFECT TRANSISTOR FOR USE IN BIPOLAR INTEGRATED CIRCUITS

[75] Inventors: Wadie N. Khadder; James P. Vokac; Robert C. Dobkin, all of Santa Clara County, Calif.

[73] Assignee: Linear Technology Corporation, Milpitas, Calif.

[21] Appl. No.: 553,181

[22] Filed: Jul. 13, 1990

Related U.S. Application Data

[63] Continuation-in-part of Ser. No. 931,263, Nov. 17, 1986, abandoned.

[51] Int. Cl.⁵ .................... H01L 29/80; H01L 29/04; H01L 23/48
[52] U.S. Cl. ........................ 357/22; 357/59; 357/71
[58] Field of Search ............ 357/22, 59, 71, 48, 357/52

[56] References Cited

U.S. PATENT DOCUMENTS

| | | |
|---|---|---|
| 3,333,115 | 7/1967 | Kawakami ................. 357/23.14 |
| 3,335,342 | 8/1967 | Leistiko et al. ................. 357/22 |
| 3,538,399 | 11/1970 | Bresee et al. ................. 357/22 |
| 3,656,031 | 4/1972 | Bresee et al. ................. 357/22 |
| 4,176,368 | 11/1979 | Compton ................. 357/22 |
| 4,185,291 | 1/1980 | Hirao et al. ................. 357/22 |
| 4,187,514 | 2/1980 | Tomisawa et al. ................. 357/22 |
| 4,267,012 | 5/1981 | Pierce et al. ................. 156/643 |
| 4,482,907 | 11/1984 | Jay ................. 357/22 |
| 4,546,366 | 10/1985 | Buchanan ................. 357/22 |

FOREIGN PATENT DOCUMENTS

8602203 4/1986 PCT Int'l Appl. .
0997996 7/1965 United Kingdom .

OTHER PUBLICATIONS

IBM Technical Disclosure Bulletin, vol. 21, #7, pp. 2757-2758 by Anantha et al., Dec. 1978.

*Primary Examiner*—Mark Prenty
*Attorney, Agent, or Firm*—Flehr, Hohbach, Test, Albritton & Herbert

[57] ABSTRACT

A high speed BIFET junction field effect transistor is formed in an epitaxial layer of one conductivity type and includes source and drain regions of opposite conductivity type interconnected by a thin channel region of the opposite conductivity type. A thin surface layer of the one conductivity type is formed over the channel region, and a highly conductive contact is formed on the surface layer intermediate the source and drain regions. The surface contact can comprise highly doped polycrystalline silicon material with a metal layer on the surface thereof. The surface contact and the epitaxial layer underlying the channel region comprise gates for the field effect transistor. Increased speed of operation comes from the increased conductivity of the surface contact.

6 Claims, 2 Drawing Sheets

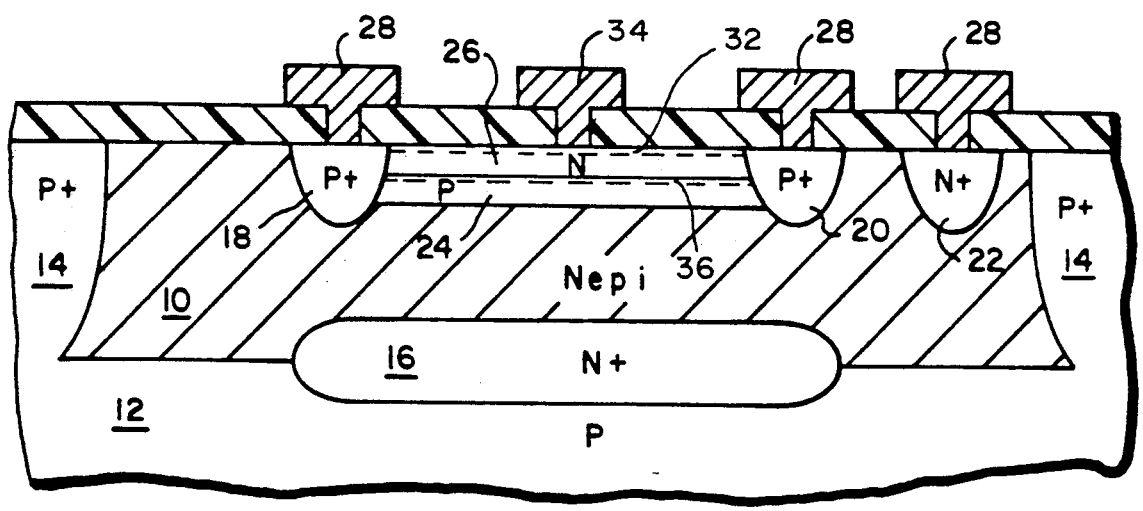
FIG. — 4

HIGH SPEED JUNCTION FIELD EFFECT TRANSISTOR FOR USE IN BIPOLAR INTEGRATED CIRCUITS

This is a continuation-in-part of co-pending application Ser. No. 931,263 filed Nov. 17, 1986 and now abandoned.

BACKGROUND OF THE INVENTION

This invention relates generally to semiconductor transistor devices, and more particularly to a high speed junction field effect transistor.

The use of junction field effect transistors (JFETs) in bipolar integrated circuits is known (BIFETs). One such transistor is disclosed in U.S. Pat. No. 4,176,368. Operating speed is an important characteristic of such a transistor. BIFET structures have included top and bottom gates with the top gate comprising a lightly doped region above the transistor channel region and with the top and bottom gates electrically connected through the semiconductor structure. U.S. Pat. No. 4,176,368 proposes a higher speed BIFET by forming a more heavily doped region in the lightly doped top gate between and separated from the source and drain regions of the transistor. The heavily doped region reduces the gate conductance from 5-15 kilo-ohms per square to a range of 500-1500 ohms per square.

JFETS having independent upper and lower gate contacts are known. The prior art teaches the use of barrier metals on the surface of the upper gate to prevent penetration of aluminum contacts into the underlying silicon material. Use of the barrier metal creates a thermal mismatch with the silicon leading to hysteresis effects during thermal cycling which degrade the device.

SUMMARY OF THE INVENTION

This invention is directed to an improved higher speed BIFET. Briefly, a highly doped polycrystalline silicon gate contact is formed on the surface of the thin, lightly doped top gate region extending between the source and drain regions. The ion implanted silicon gate contact is electrically separated from the bottom contact, thereby permitting a four-terminal device operation, if desired. A metal contact such as aluminum, for example, can be placed on the surface of the polysilicon layer to further reduce resistance. The polycrystalline layer inhibits punch through (diffusion) of the aluminum contact metal into the gate and channel regions by the aluminum contact. The lightly doped top gate layer beneath the polysilicon gate contact can be more heavily doped by diffusion from the highly doped polycrystalline layer to increase its conductivity. Advantageously, the gate resistance in accordance with this invention can be reduced to on the order of 1-40 ohms per square, as opposed to the 500-1500 ohms per square for the device disclosed in the '368 patent. The polycrystalline layer permits high temperature processing and the formation of thermal oxide on the surface of the layer.

OBJECTS OF THE INVENTION

Accordingly, an object of the invention is to provide an improved silicon BIFET.

Another object of the invention is to provide a BIFET having increased operating speed.

A further object of this invention is to provide a BIFET which can be thermally cycled without degradation of device performance.

The objects and features of this invention will be more readily apparent from the following detailed description and dependent claims when taken with the drawings.

BRIEF DESCRIPTION OF THE DRAWINGS

FIG. 4 is a sectional view in accordance with another embodiment of the invention.

DETAILED DESCRIPTION OF THE DRAWINGS

Figure 1:
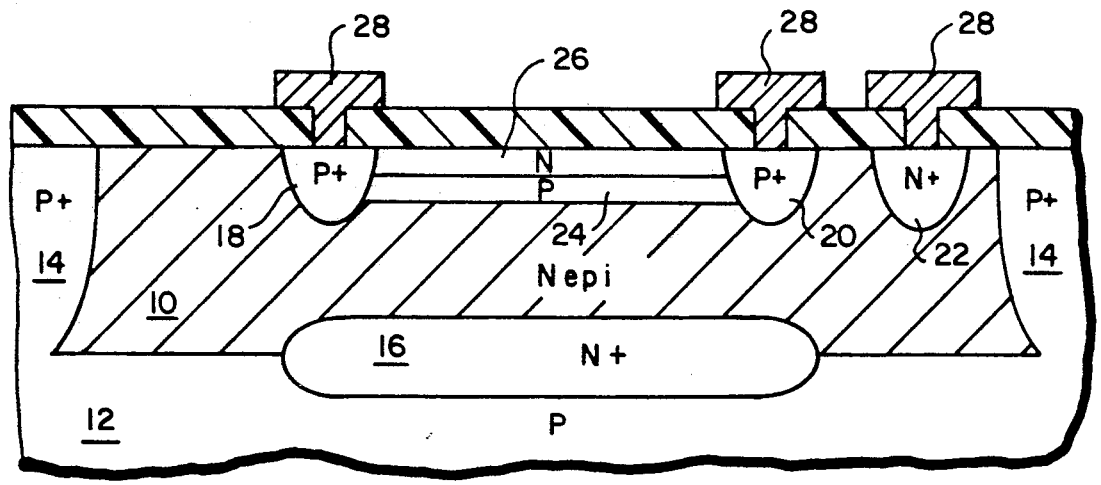
FIG. 1 is a sectional view of a BIFET device in accordance with the prior art.
Figure 2:
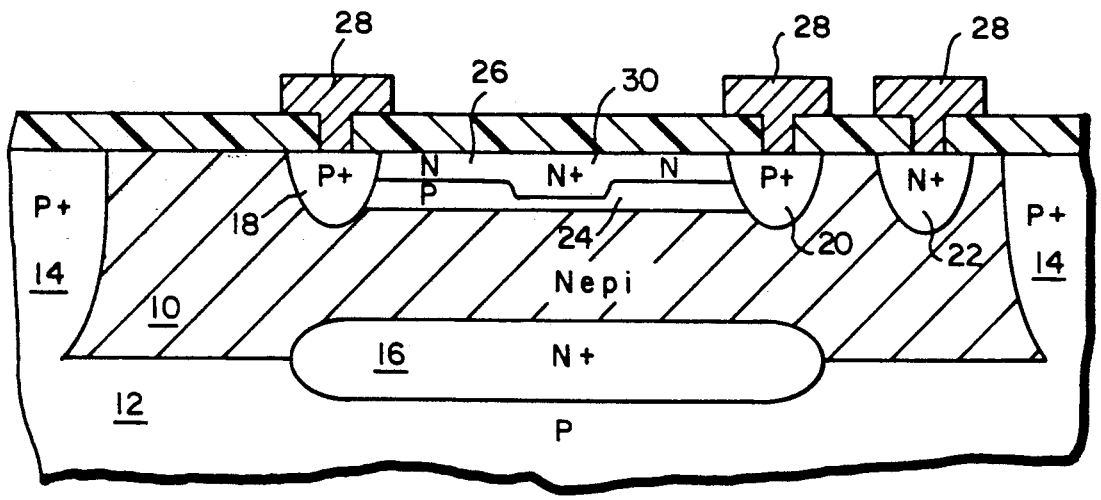
FIG. 2 is a sectional view of another BIFET device in accordance with the prior art.

Turning to the drawings, FIGS. 1 and 2 are sectional views of prior art BIFET devices as disclosed in U.S. Pat. No. 4,176,368. In accordance with the device of FIG. 1, an N-type epitaxial layer 10 is formed on a surface of P-type silicon substrate 12 with a device region defined by P+ isolation diffusion ring 14. An N+ buried layer 16 is formed by doping a surface region of substrate 12 prior to the epitaxial growth of layer 10. A BIFET device is then formed in the epitaxial layer 10 with a source region 18 and a spaced drain region 20 formed by diffusion with P+ dopants. A gate contact 22 is formed by diffusion with N+ dopant. A P-type channel region 24 is formed by ion implantation between the source and drain region 18, 20, and a lightly doped top gate layer 26 is formed by ion implantation on the surface between the source and drain regions. The N-type top gate layer 26 is interconnected with the bottom gate contact defined by epitaxial layer 10 through the epitaxial structure. Metal contacts 28 are made to the source, drain and gate region.

In order to increase the speed of the device shown in FIG. 1, the '368 patent proposes the structure disclosed in FIG. 2. The same reference numbers are used for like elements. In this embodiment, a high doped region 30 in the lightly doped top gate contact region 26 is formed by the selective introduction of N-type dopants by ion implantation, for example. Again, the N+ region 30 is electrically interconnected with the bottom gate contact comprising epitaxial layer 10 through the epitaxial structure. Due to the increased conductance of N+ layer 30, the gate resistance is reduced from approximately 5-15 kilo-ohms per square with the device of FIG. 1 to 500-1500 ohms per square with the device of FIG. 2. The reduction in gate resistance results in a significant increase in operating speed.

Figure 3:
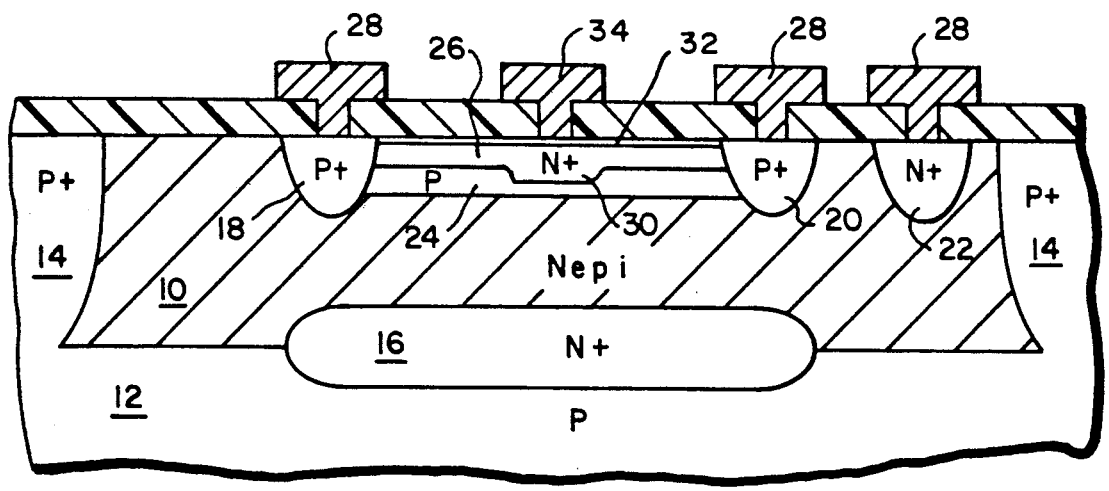
FIG. 3 is a sectional view of a BIFET device in accordance with one embodiment of the invention.

FIG. 3 is a sectional view of a silicon BIFET device in accordance with this invention. Again, like elements have the same reference numbers as in FIGS. 1 and 2. In accordance with the invention, a highly doped polysilicon contact 32 is made to an intermediate portion of the lightly doped top layer 26, spaced from the source and drain region 18, 20. As illustrated in FIG. 3, a highly doped region 30 is provided in the lightly doped gate layer 26 beneath the contact 32 as in the embodiment of FIG. 2. However, the increased speed of operation of the device of FIG. 3 depends primarily on the provision of the high conductance contact as described below, and only secondarily on the provision of the highly doped region 30. Thus, the provision of region 30 is not essential to the invention.

In a preferred embodiment, the contact comprises a thin layer of highly doped polycrystalline silicon 32 and a metal layer 34 of aluminum, for example, provided on the top surface of contact 32, thereby further increasing the conductance of the contact and further increasing the speed of operation. The highly doped polysilicon layer 32 not only increases the conductance of the contact to the gate region 30, but also inhibits punch through of the aluminum contact during subsequent high temperature processing steps, and provides impurities which diffuse into the region 30 to increase its conductance. The polysilicon layer is thermally matched to the substrate, thereby minimizing degradation of the device during thermal cycling.

The top gate contact is isolated from the bottom gate contact, thereby providing a four-terminal device. The smaller area of the top gate metal contact 34 reduces the parasitic capacitance and leakage current.

FIG. 4 shows an embodiment of the invention without a high conductance region 30. In this embodiment, the impurities from the polysilicon layer are not only allowed to diffuse into the underlying gate region 26, but also into the channel region as shown by the dotted line 36. This effectively reduces the thickness of the channel and increases the frequency of operation.

The provision of a highly doped polysilicon gate contact on the lightly doped top gate layer and diffusion of impurities thereinto can reduce the top gate resistance to the order of 1–40 ohms per square. This low resistance, coupled with the four-terminal operation of the BIFET, enhances the operating speed significantly over the prior art BIFET structures.

While the invention has been described with reference to specific embodiments, the description is illustrative of the invention, and not to be construed as limiting the invention. Various modifications and applications may be apparent by those skilled in the art without departing from the true spirit and scope of the invention as defined by the appended claims.

What is claimed is:

1. A high speed junction field effect transistor comprising
a silicon semiconductor body region of one conductivity type,
first and second regions of opposite conductivity type formed in a surface of said body region extending into said body of one conductivity type and spaced from each other, said first and second regions forming a source and a drain of said transistor,
a thin channel region of said opposite conductivity type in said body region and interconnecting said first and second regions,
a thin surface gate layer of said one conductivity type overlying said channel region and extending from said first region to said second region, and
a surface contact on said surface gate layer extending between said first and second regions and electrically isolated from said body region, said surface contact comprising a polycrystalline silicon layer of said one conductivity type and extending over the entire surface of the surface gate layer and having a conductivity greater than the conductivity of said thin surface gate layer, said body region beneath said channel region and said surface contact comprising electrically separate gates for said transistor, and
an aluminum metal contact on said polycrystalline silicon layer.

2. A high speed junction field effect transistor as in claim 1 in which said thin surface gate layer includes impurities diffused thereinto from said polysilicon layer.

3. A high speed junction field effect transistor comprising
a silicon semiconductor body region of one conductivity type,
first and second regions of opposite conductivity type formed in a surface of said body region and spaced from each other, said first and second regions forming a source and a drain of said transistor,
a thin channel region of said opposite conductivity type in said body region and interconnecting said first and second regions,
a thin surface gate layer of said one conductivity type overlying said channel region and extending from said first region to said second region, and
a surface contact on said surface gate region between said first and second regions and electrically isolated from said body region, said surface contact comprising polycrystalline silicon layer of said one conductivity type and having a conductivity greater than the conductivity of said surface gate layer, said body region beneath said channel region and said surface contact comprising electrically separate gates for said transistor, said thin surface gate layer and an upper region of said channel region include impurities diffused thereinto from said polysilicon layer and
an aluminum metal contact on said polycrystalline silicon layer.

4. The field effect transistor as in claim 3 wherein said semiconductor body region comprises an epitaxial layer, and further including a substrate of said opposite conductivity type on which said epitaxial layer is formed.

5. The field effect transistor as in claim 4 and further including a buried layer of said first conductivity type formed in said substrate at the interface of said epitaxial layer and positioned beneath said first and second regions.

6. The field effect transistor as in claim 5 and further including an isolation region of said opposite conductivity type extending from the surface of said epitaxial layer to said substrate and surrounding said first and second regions.

* * * * *